United States Patent [19]

Nguyen et al.

[11] Patent Number: 5,532,655

[45] Date of Patent: Jul. 2, 1996

[54] METHOD AND APPARATUS FOR AC/DC SIGNAL MULTIPLEXING

[75] Inventors: Nhat M. Nguyen, San Jose; Kevin J. Negus, Palo Alto, both of Calif.

[73] Assignee: Hewlett-Packard Company, Palo Alto, Calif.

[21] Appl. No.: 393,634

[22] Filed: Feb. 24, 1995

[51] Int. Cl.[6] .................................................. H03H 1/02
[52] U.S. Cl. ............................. 333/1; 327/551; 330/297; 330/307; 333/132
[58] Field of Search ............................. 333/100, 103, 333/104, 132, 262, 1; 327/551; 330/297, 307

[56] References Cited

U.S. PATENT DOCUMENTS

| | | | |
|---|---|---|---|
| 3,179,816 | 4/1965 | Hall et al. | 333/104 X |
| 5,272,450 | 12/1993 | Wisherd | 330/297 |
| 5,327,017 | 7/1994 | Fischer et al. | 333/103 X |

Primary Examiner—Paul Gensler
Attorney, Agent, or Firm—Jonathan B. Penn

[57] ABSTRACT

A method for using the same input/output pin on an integrated circuit ("IC") for both a high frequency AC signal and a DC signal simultaneously and a first circuit means to accomplish this multiplexing is disclosed. The circuit topology comprises a first and second capacitor, coupled between the AC signal input and the AC signal output. A first and second resistor are coupled to the same input/output pin as the capacitors but between the two capacitors and respectively to a DC signal input and DC signal output. The DC signal path thus lies between the two capacitors and sees them as open circuits, while the AC signal path sees the two resistors as open circuits and the capacitors as short circuits.

7 Claims, 3 Drawing Sheets

METHOD AND APPARATUS FOR AC/DC SIGNAL MULTIPLEXING

BACKGROUND OF THE INVENTION

The present invention relates generally to integrated circuits("IC"s)for high frequency applications and specifically to multiplexing AC and DC signals into and out of such integrated circuits.

The use of resistors and capacitors to create filters, in various combinations and topologies is well known. For example, it is well known that an appropriately sized capacitor will act to filter out DC and low frequency AC signals and noise on an AC signal input line.

Although the use of these elements as filters is well known, certain aspects of their use create undesirable operational constraints. In the IC field, the number of input/output pins that can be fabricated as part of a single package is one constraint in the design of the IC itself. Having to allocate a separate input/output pin to each individual AC or DC signal, or having to allocate a given pin to either DC signals or AC signals is undesirable.

No known circuit permits the use of a single IC input/output pin for both AC and DC signals simultaneously.

SUMMARY OF THE INVENTION

A first preferred embodiment of the present invention comprises a method and circuit which permits the simultaneous transmission of a first AC signal and a first DC signal through a single input/output pin of an IC. A first and second capacitance, located respectively within the IC and on the circuit board upon which the IC is mounted, appear as an open circuit to the DC signal and as a low impedance path to the AC signal. A first and second resistance, located respectively within the IC and on the circuit board upon which the IC is mounted, appear as a low impedance path to the DC signal and as a high impedance path to the AC signal. As both resistors and both capacitors are coupled to the same input/output pin of the IC, they permit the one pin to simultaneously transmit/receive a DC and AC signal, thus effectively multiplexing the pin.

The present invention will now be described in detail, with reference to the figures listed and described below.

DETAILED DESCRIPTION OF THE PREFERRED EMBODIMENTS

Figure 1:
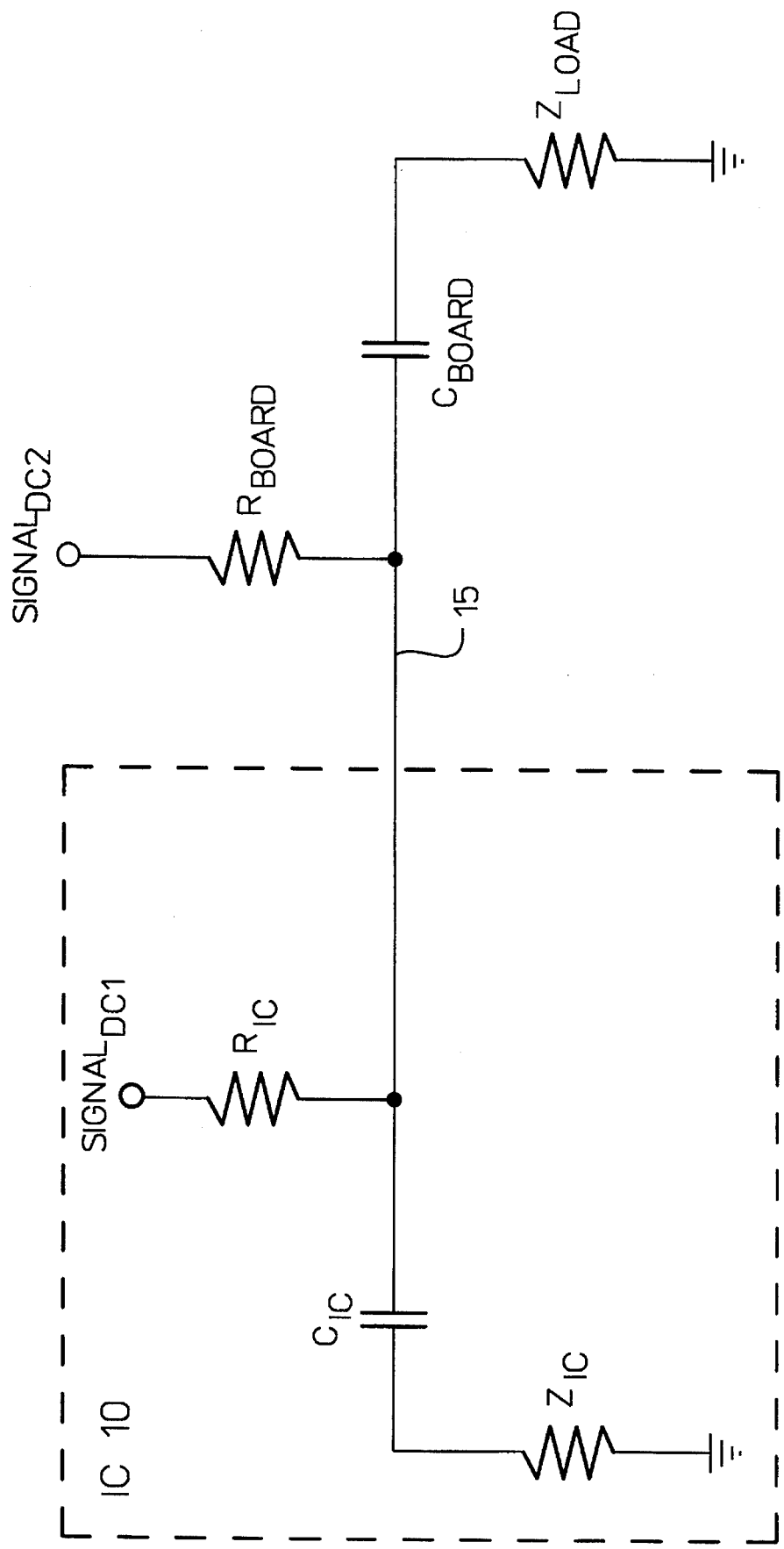
FIG. 1 is a generalized schematic diagram showing the first embodiment of the present invention.

FIG. 1 is a generalized schematic showing how the method taught by the present invention can be realized. A single IC input/output pin 15 is coupled to an external resistor $R_{Board}$ and an external capacitor $C_{Board}$. In turn $R_{Board}$ is coupled to a DC signal input/output $Signal_{DC2}$. $C_{Board}$ is in turn coupled to a load impedance $Z_{Load}$. The nature of the load impedance is not relevant to the present invention, as it merely represents either the source or destination of an AC signal. Within IC 10, pin 15 is coupled to a resistor and capacitor fabricated as part of the IC and labelled respectively $R_{IC}$ and $C_{IC}$. $R_{IC}$ is in turn coupled to DC signal input/output $Signal_{DC1}$ and $C_{IC}$ is in turn coupled to an IC impedance $Z_{IC}$. The nature of the IC impedance is similarly not relevant to the present invention, as it merely represents either the source or destination of an AC signal.

Figure 2:
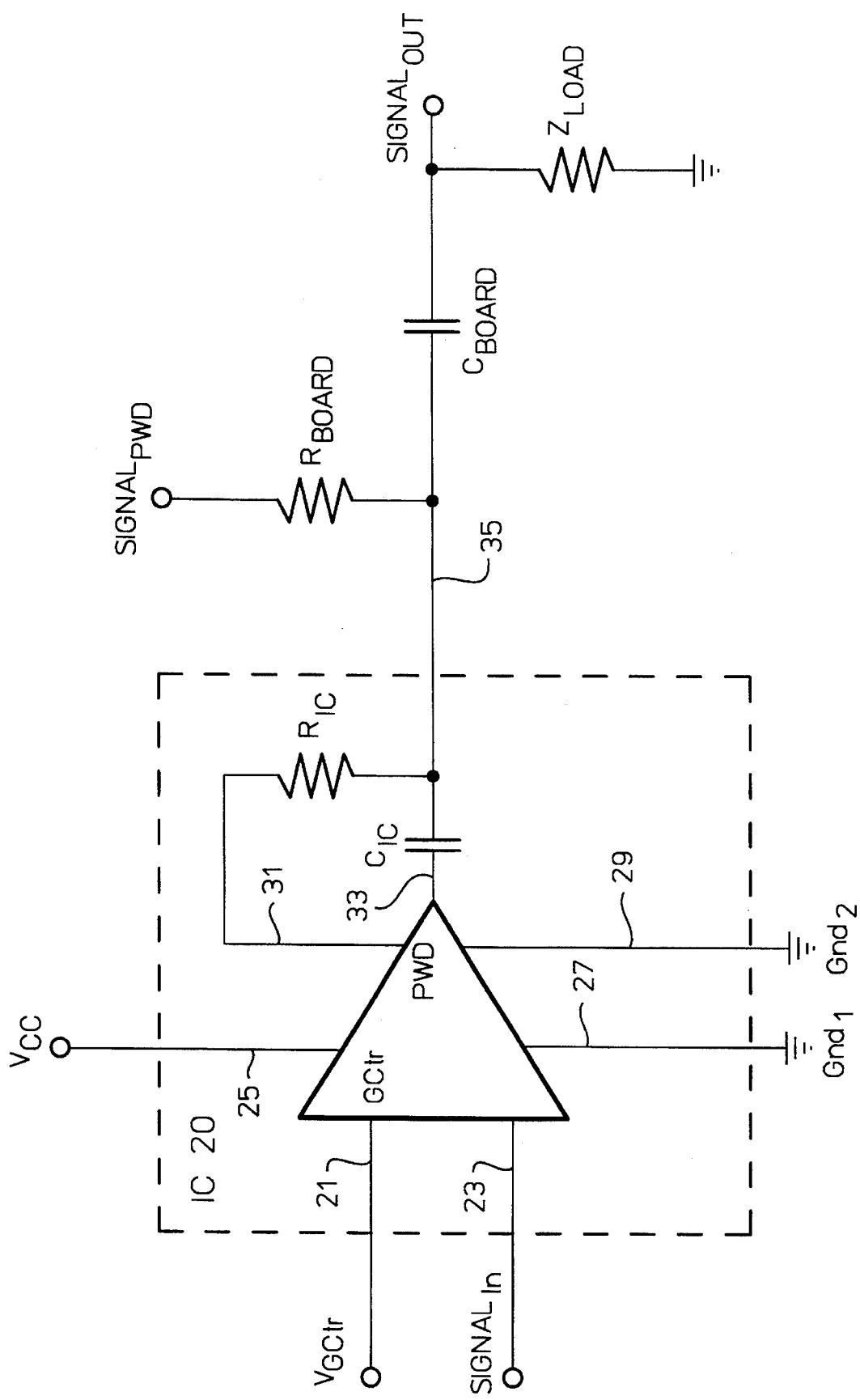
FIG. 2 is a block diagram of a first specific circuit using the present invention.

In operation, when a DC signal is generated by IC 10 at $Signal_{DC1}$, it travels through $R_{IC}$ and $R_{Board}$ to $Signal_{DC2}$. Both $C_{IC}$ and $C_{Board}$ appear as open circuits to the DC signal, which therefore cannot affect either $Z_{Load}$ or $Z_{IC}$. When an AC signal is generated by IC 10 at $Z_{IC}$ it travels over pin 15 to $Z_{Load}$. In this instance, resistors $R_{IC}$ and $R_{Board}$, which are of comparatively large resistance, appear as open circuits and do not have a loading effect on the AC signal, preventing the AC signal from appearing at either the source or destination of the DC signal. Circuit operation in the case where the DC signal originates at $Signal_{DC2}$ and/or the AC signal originates at $Z_{Load}$ is the mirror image of the operation just described. In this manner, the AC and DC signal paths are effectively independent of one another FIG. 2 is a schematic drawing of a first circuit embodying the present invention. IC 20 is a high frequency amplifier with six input/output lines. Although each input/output line has an associated parasitic impedance, these have not been shown as their magnitude does not affect the operation of the present invention. Input/output line 21 applies a voltage to the operational amplifier, which voltage controls the gain of the amplifier. Input/output line 23 is the AC signal input to the amplifier. Input/output lines 27 and 29 are, respectively, the first and second ground lines for the amplifier. Input/output line 25 provides DC power $V_{CC}$ to the amplifier. Finally, input/output line 35 is multiplexed using the present invention to provide a DC power down signal ("PWD") to the amplifier on line 31 as well as an AC signal output 33 from the amplifier.

In this embodiment, $R_{IC}$ and $C_{IC}$ are coupled to input/output pin 35 and then respectively to the power down input or the amplifier and to the AC signal output of the amplifier. External to IC 20, input/output pin 35 is coupled to $R_{Board}$ and $C_{Board}$. $R_{Board}$ is further coupled to a power down signal input. $C_{Board}$ is further coupled to an AC signal output and a load impedance $Z_{Load}$.

In operation, the circuit illustrated by FIG. 2 provides a DC signal path through $C_{Board}$ and $R_{IC}$ while simultaneously providing an AC signal output through $C_{IC}$ and $C_{Board}$, the respective AC and DC signal paths sharing simultaneously input/output pin 35.

Figure 3:
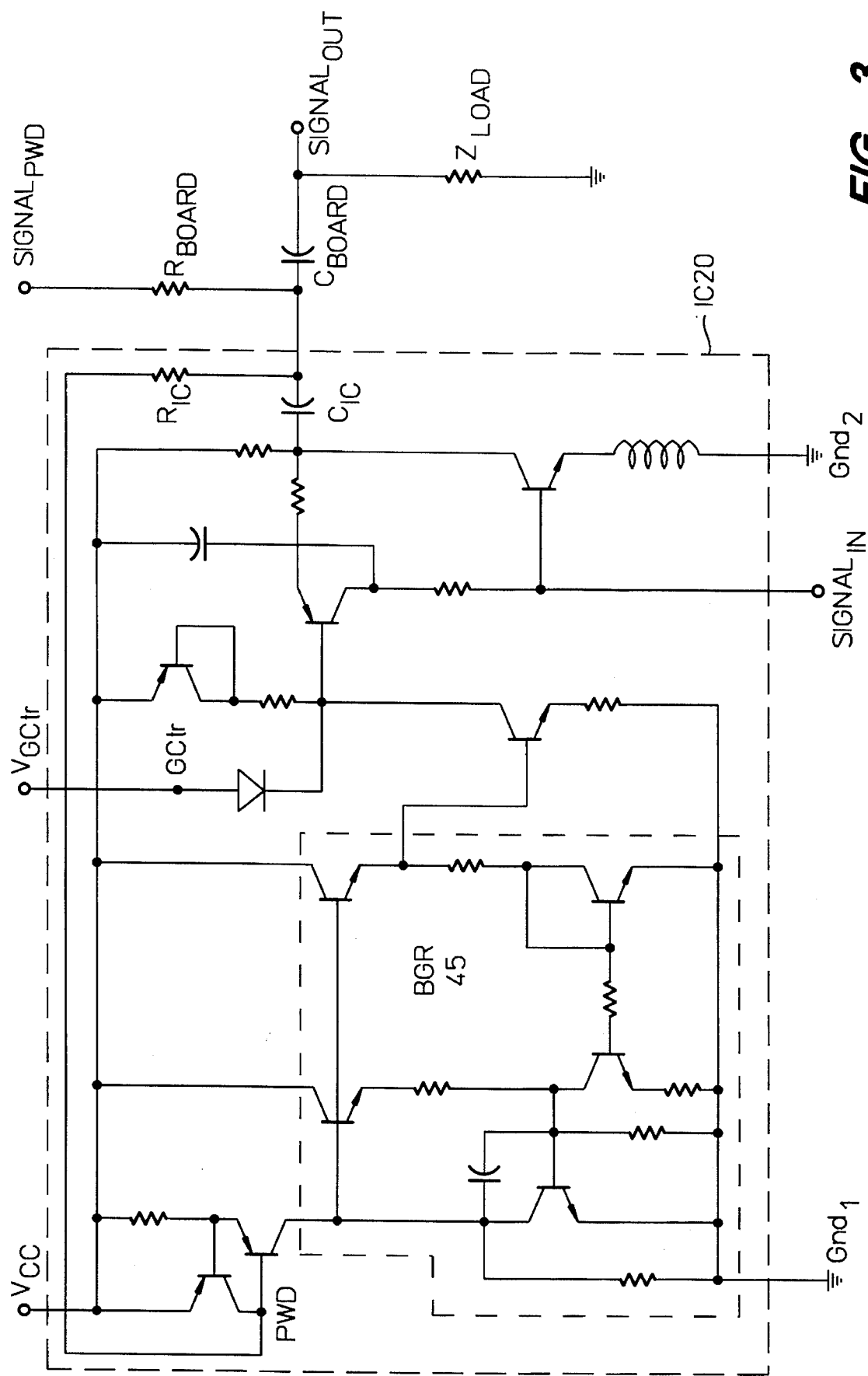
FIG. 3 is a detailed schematic drawing of the circuit shown in FIG. 2.

Fig. 3 is a detailed schematic diagram of the circuit illustrated more generally in FIG. 2. Components having the same function are labelled identically with those in FIG. 2. The circuits in FIGS. 2 and 3 are functionally identical. Band gap reference circuit ("BGR") 45 operates in a known fashion to generate a reference voltage for the amplifier. In operation, the circuit shown in FIG. 3 operates at 500 MHz and above.

The teachings of the present invention are not of course limited to the multiplexing of only one input/output pin in a given IC. The number of pins that can be multiplexed in this fashion is only limited by such practical concerns as the amount of IC die space required to fabricate the necessary resistors and capacitors. Although proper sizing of both the resistors and capacitors to filter out the desired/undesired frequencies is necessary, the methods and techniques to determine the size of these components is well within the known art. Although IC fabrication techniques would commonly limit the size of $C_{IC}$ to less than 100 picofarads, nothing herein should be taken to limit the present invention

What is claimed is:

1. In an integrated circuit having a plurality of input/output leads, a method for transmitting a first AC signal and a first DC signal over the same input/output lead simultaneously, the method comprising the steps of:

coupling an input/output lead to a first integrated circuit capacitance and to a first integrated circuit resistance;

coupling the input/output lead to a first printed circuit board capacitance and to a first printed circuit board resistance;

applying the first AC signal to one of the first integrated circuit capacitance and the first printed circuit board capacitance, the AC signal traveling through the input/output lead to the other capacitance; and applying the first DC signal to one of the first integrated circuit resistance and the first printed circuit resistance, the DC signal traveling through the input/output lead to the other resistance, the printed circuit board and the integrated circuit capacitances appearing as open circuits to the DC signal and the printed circuit board and the integrated circuit resistances appearing as open circuits to the AC signal.

2. A multiplexing circuit for at least a first AC signal and a first DC signal, the signals being transmitted simultaneously over the same input/output lead of an integrated circuit, the circuit comprising:

a first capacitor, fabricated as part of the integrated circuit, the first capacitor being coupled to a first AC signal port on the integrated circuit and to the input/output lead;

a first resistor, fabricated as part of the integrated circuit, the first resistor being coupled to a first DC signal port on the integrated circuit and to the input/output lead;

a second capacitor, the second capacitor being coupled to the input/output lead and to a load impedance; and a second resistor, the second resistor being coupled to the input/output lead and to a second DC signal port, the first and second resistors and the input/output lead forming a first DC signal path, the first and second capacitors appearing as open circuits to the DC signal, and the first and second capacitors and the input/output lead forming a first AC signal path, the first and second resistors appearing as open circuits to the AC signal.

3. The circuit of claim 2 wherein the integrated circuit comprises a plurality of input/and output leads, each input/output lead having a multiplexing circuit coupled thereto.

4. The mutiplexing circuit of claim 2 wherein the AC signal is at least a 500 MHz signal.

5. A circuit for permitting the simultaneous transmission of an AC signal and a DC signal through the same electrical transmission medium, the circuit comprising:

a first and second resistance, each coupled respectively to a first and second terminus of the transmission media and to a first and second DC signal port; and a first and second capacitance, each coupled respectively to the first and second terminuses of the transmission media and to a first and second AC signal port, the capacitances permitting the AC signal to be transmitted from the first to the second AC signal port and the resistance permitting the DC signal to be transmitted from the first to the second DC signal port without interference with one another, and wherein the first resistance and the first capacitance are fabricated as part of an integrated circuit and the second resistance and the second capacitance are formed as discrete components on a printed circuit board upon which the intergrated circuit is mounted and to which the intergrated circuit is electrically coupled.

6. The circuit of claim 5 wherein the AC signal has a frequency of at least 50 MHz.

7. The circuit of claim 7 wherein one circuit is coupled to each of a plurality leads which are coupled to the integrated circuit.

* * * * *